(12) United States Patent
Karlquist

(10) Patent No.: US 8,483,318 B2
(45) Date of Patent: Jul. 9, 2013

(54) SPLIT BAND SIGNAL PROCESSING

(75) Inventor: Richard K Karlquist, Cupertino, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1150 days.

(21) Appl. No.: 12/264,773

(22) Filed: Nov. 4, 2008

(65) Prior Publication Data
US 2010/0109799 A1    May 6, 2010

(51) Int. Cl.
*H04L 27/00* (2006.01)
*H03K 9/00* (2006.01)

(52) U.S. Cl.
USPC ............ 375/316; 375/229; 375/224; 375/219

(58) Field of Classification Search
USPC .................... 375/316, 229, 224, 219
See application file for complete search history.

(56) References Cited

U.S. PATENT DOCUMENTS

| | | | | |
|---|---|---|---|---|
| 4,812,789 A | * | 3/1989 | Lee | 333/135 |
| 5,021,756 A | * | 6/1991 | Tajima et al. | 333/132 |
| 6,538,509 B2 | * | 3/2003 | Ren | 330/149 |
| 6,737,935 B1 | * | 5/2004 | Shafer | 333/132 |
| 2003/0198289 A1 | * | 10/2003 | Cooper et al. | 375/229 |
| 2004/0060074 A1 | * | 3/2004 | Basawapatna et al. | 725/131 |
| 2009/0113511 A1 | * | 4/2009 | Lee | 725/129 |

OTHER PUBLICATIONS

Cristal, et al., "A Technique for the Design of Multiplexers Having Contiguous Channels", IEEE Transactions on Microwave Theory and Techniques, Jan. 1964, p. 88.
Wenzel, "Application of Exact Synthesis Methods to Multichannel Filter Design", IEEE Transactions on Microwave Theory and Techniques, Jan. 1965, p. 5.

* cited by examiner

*Primary Examiner* — Kenneth Lam

(57) ABSTRACT

A split-band system for processing a broadband input signal is disclosed. A signal divider divides the input signal into at least a higher frequency band and a lower frequency band. The lower frequency band is processed in a lower frequency circuit path. The higher frequency band is processed in a higher frequency circuit path. The higher frequency circuit path has a group delay equal to the lower frequency circuit path. A signal combiner combines the processed lower frequency band and the processed higher frequency band into an output signal.

20 Claims, 8 Drawing Sheets

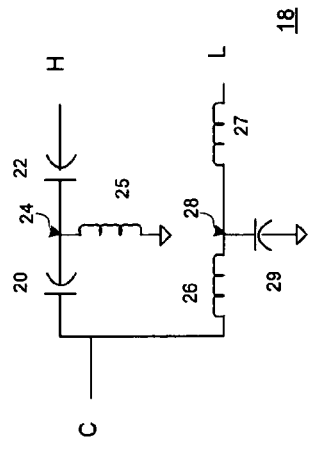
Figure 2A
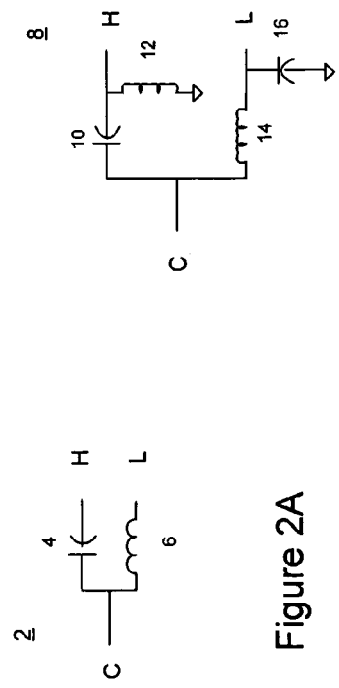
Figure 2B
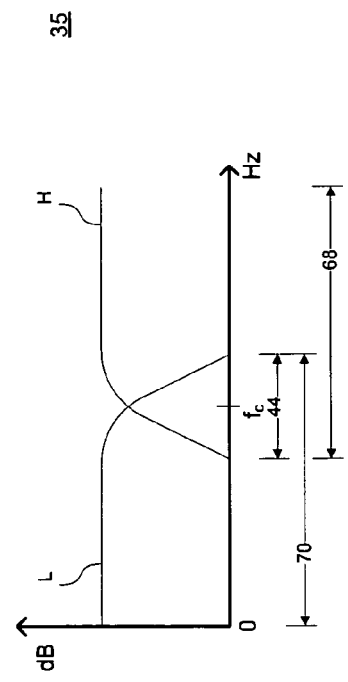
Figure 2C
Figure 3

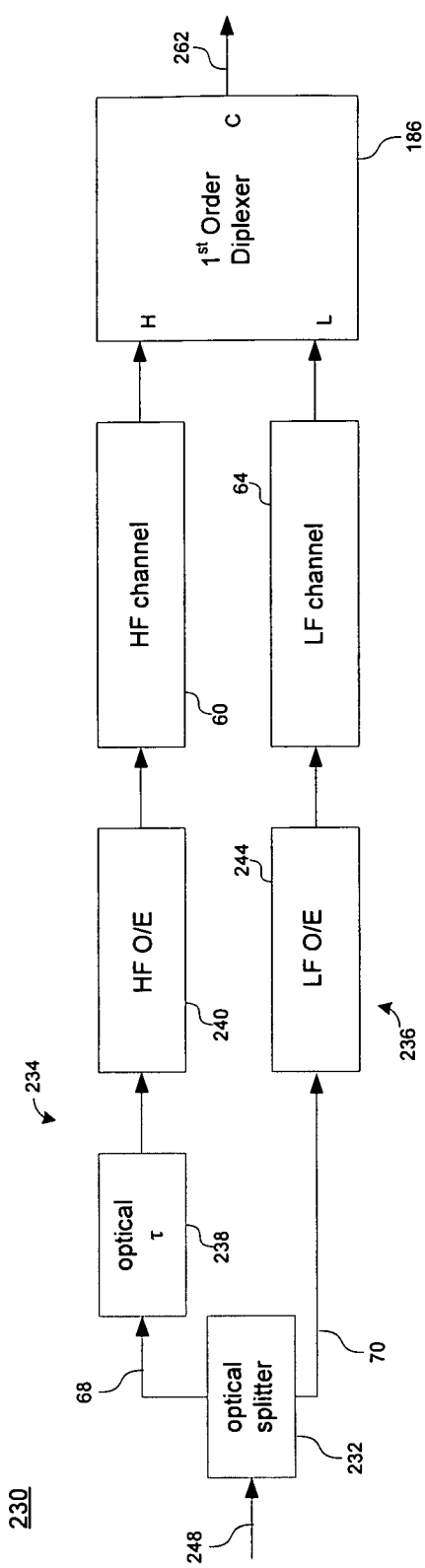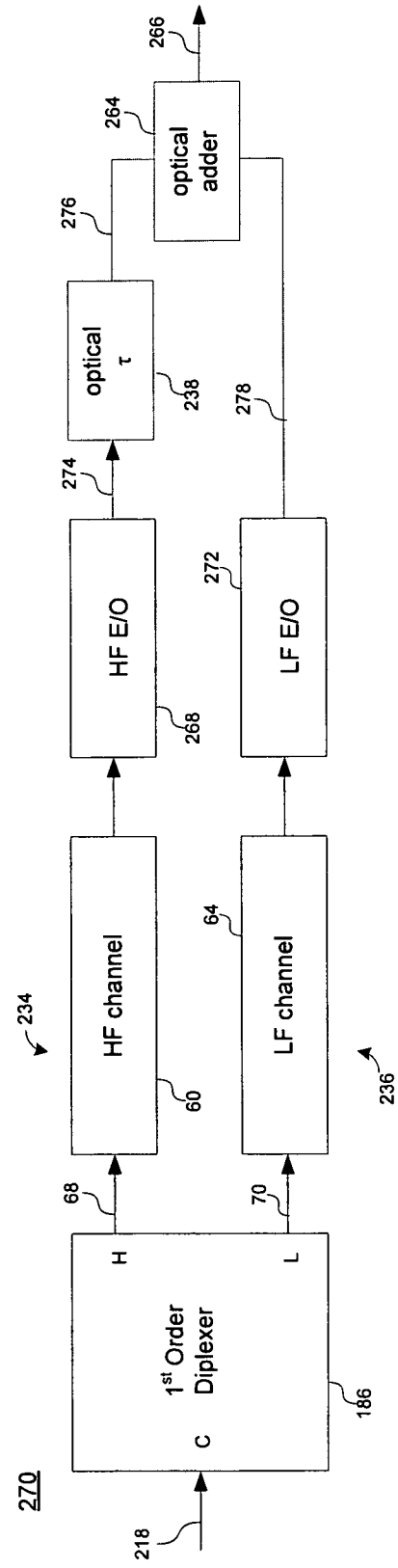
Figure 9A
Figure 9B

SPLIT BAND SIGNAL PROCESSING

BACKGROUND

This invention relates to the field of linear broadband signal generation, processing, and capture/analysis. Typical broadband signal generation devices include, but are not limited to, arbitrary waveform generators, digital pattern generators, and RF signal generators. Typical broadband signal processing devices include, but are not limited to, amplifiers and attenuators. Typical broadband signal capture/analysis devices include, but are not limited to, oscilloscopes, waveform recorders, spectrum analyzers, and bit error rate testers. Network analyzers are another common class of broadband device that performs both signal generation and analysis. The term "broadband" as used herein refers to systems that cover a contiguous band of frequencies starting at zero Hertz (Hz) (or low frequencies near 0 Hz) and extending well into the radio frequency (RF) and/or microwave range, which includes signal frequencies of at least 100 MHz and higher. A system with frequency coverage extending to zero frequency is commonly referred to as being "DC-coupled."

The signals in these broadband systems may exist in either digital or analog form, or a combination thereof. The systems may include analog to digital converters (ADCs) and/or digital to analog converters (DACs), which are collectively referred to as "data converters".

It is often necessary to do linear processing of signals while they are in analog form. However, linear signal processing components such as amplifiers, attenuators, DC level shifters, and balanced-to-unbalanced converters (commonly known as "baluns") are not amenable to working over a very large bandwidth, especially when the bandwidth extends to low frequencies near or at 0 Hz. These limitations are well known to persons skilled in the art of analog circuit design. For example, amplifiers that can handle zero Hertz have inferior performance compared to more narrowband amplifiers in terms of noise, distortion, and efficiency. There remains a need for an improved broadband system for linear signal processing.

BRIEF DESCRIPTION OF THE DRAWINGS

FIGS. 2A-2C show various exemplary diplexers.

FIG. 3 shows a frequency response graph for the high-pass and low-pass filters in an exemplary diplexer.

FIGS. 9A-9B show embodiments of an optical/electrical split band processing system.

DETAILED DESCRIPTION

An improved broadband system for linear signal processing can be achieved by splitting the signal into two or more frequency bands, processing them individually with circuitry optimized for each frequency band, and then recombining the signals back together into a single broadband signal. (For the sake of simplicity, 2-band systems will be used for illustrative purposes, but it should be understood that the principles taught herein can be applied by one of ordinary skill in the art to systems split into more than two frequency bands.) It is desirable that the split band processing circuitry simply facilitate the processing implemented by the individual circuits for each band, and not impart any of its own side effects on the signal. The criterion for a successful band splitting implementation is that the transfer function is as close as possible to unity (i.e. 1) when measured without any additional signal processing in the bands. A transfer function $H(j\omega)$ can be defined as $Y(j\omega)/X(j\omega)$, where $Y(j\omega)$ is the Laplace transform of the signal at the output of the system and $X(j\omega)$ is the Laplace transform of the signal at the input to the system. Angular frequency is given by $\omega$.

Two classes of performance can be defined for such systems. The highest class of performance seeks to achieve $H(j\omega)=1$ for all frequencies (i.e., all values of $\omega$.) In this case, the magnitude of the frequency response will ideally be flat, i.e. $|H(j\omega)|=1$ for all $\omega$ and the group delay will also be flat, i.e. $d\{\arg[H(j\omega)]\}/d\omega=k$ for all $\omega$, where k is a constant. Constant group delay is equivalent to linear phase. In the case of applications that are insensitive to phase, a reduced class of performance is useful where the only goal is flat magnitude, i.e. $|H(j\omega)|=1$ for all $\omega$. An additional requirement in both cases is that the input and output be matched to the system characteristic impedance, typically 50 ohms.

Figure 1A:
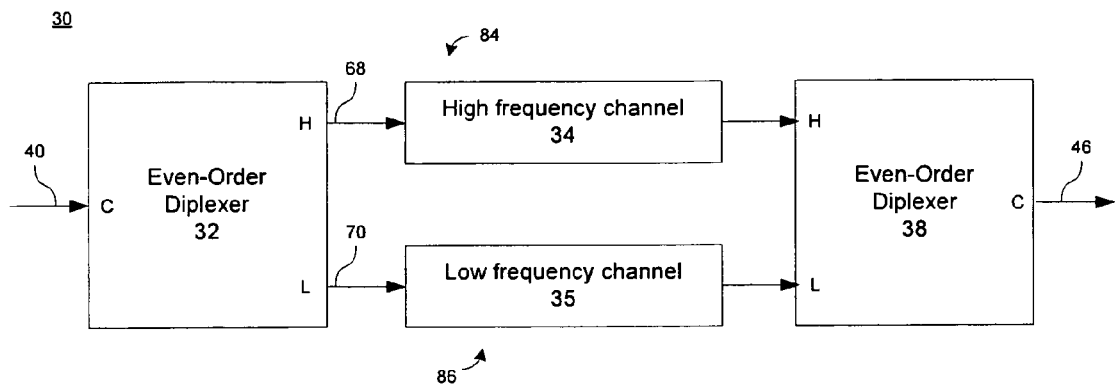
FIG. 1A shows an embodiment of a split band processing system with even-order diplexers.

FIG. 1A shows a high-level block diagram of one embodiment of a split band processing system 30 that is suitable for phase insensitive applications. The split band processing system 30 includes an even-order diplexer 32, a high frequency (HF) circuit path 84, a low frequency (LF) circuit path 86, and another even-order diplexer 38 that is identical to diplexer 32. (Diplexers will be discussed in more detail shortly). The HF circuit path 84 includes a high frequency (HF) channel 34, and the LF circuit path 86 includes a low frequency (LF) channel 35. The HF channel 34 includes linear signal processing circuitry optimized for operation at higher frequencies, which may include AC-coupled amplifiers. The LF channel 36 includes linear signal processing circuitry optimized for operation at lower frequencies, which may include DC-coupled amplifiers. The group delay of the HF channel 34 and the LF channel 35 are matched.

At this point, diplexers must be discussed in more detail before continuing in the description of FIG. 1A, so that the system 30 can be understood in full. Diplexers can be used to separate signals into two bands. A diplexer has three ports: a low frequency port, a high frequency port, and a composite port. An input signal applied to the composite port is split so that low frequencies are passed to the low frequency port, and the high frequencies are passed to the high frequency port. An ideal diplexer would be lossless and would be matched at all ports. It is known that this condition can be achieved if the diplexer consists of a dual pair of singly-terminated low pass and high pass filters, connected as shown in FIGS. 2A-C. "Dual pair" refers to the fact that the low pass filter is the dual circuit of the high pass filter. Furthermore, the filters should be complementary (including Butterworth filters), or substantially complementary (including Chebyshev and Cauer filters). The design of such constituent filters is known in the art. See for example: "A Technique for the Design of Multiplexers Having Contiguous Channels" by E. G. Cristal and G. L. Matthaei, IEEE Transactions on Microwave Theory and Techniques, January 1964, pg 88; and "Application of Exact Synthesis Methods to Multichannel Filter Design" by R. J. Wenzel, IEEE Transactions on Microwave Theory and Techniques, January 1965, pg 5. The constituent filters can be of any order, starting with 1, and the resulting diplexers will be referred to as first, second, or third order diplexers, etc., following the order of the constituent filters. Similar devices (generically referred to as multiplexers) can be designed to split an input signal into N channels, where N>2. For the sake of simplicity, the examples hereinafter will be described and illustrated with diplexers that split an input signal into two channels, but it should be obvious to one of ordinary skill in the art that multiplexers may be used to obtain N>2 channels if desired.

FIG. 2A shows a first-order diplexer 2. The 3 ports of the diplexer are: a composite port (C), a low frequency port (L), and a high frequency port (H). A capacitor 4 is connected between the C and H ports to form a high-pass filter. An inductor 6 is connected between the C and L ports to form a low-pass filter.

FIG. 2B shows a second-order diplexer 8. In the high-pass filter, a capacitor 10 is connected between the C and H ports. An inductor 12 is connected between the H port and ground. In the low-pass filter, an inductor 14 is connected between the C and L ports. A capacitor 16 is connected between the L port and ground.

FIG. 2C shows a third-order diplexer 18. In the high-pass filter, two capacitors 20 and 22 are connected in series between the C and H ports. The node between the two capacitors 20 and 22 is identified with reference number 24. An inductor 25 is further connected between node 24 and ground. In the low-pass filter, two inductors 26 and 27 are connected in series between the C and L ports. The node between the two inductors 26 and 27 is identified with reference number 28. A capacitor 29 is further connected between node 28 and ground.

FIG. 3 shows a frequency response graph 35 for the high-pass and low-pass filters in each diplexer. Line H represents the frequency response of the high-pass filter. Line L represents the frequency response of the low-pass filter. Each diplexer has a defined crossover frequency $f_c$ where an input signal at the composite port will divide equally between the low frequency and high frequency ports. Around the crossover frequency, there will be a transition band 44 where each port H and L will receive a significant portion of the signal at the composite port. The proportioning between ports H and L is a function of frequency. Below the transition band 44, only a negligible amount of the signal at the composite port will propagate to the high frequency port. Similarly, above the transition band 44, only a negligible amount of composite signal will propagate to the low frequency port.

Each diplexer is a reciprocal device that can be used to combine signals as well as separate them. When a diplexer is used to combine signals, the H and L ports become the inputs, and the C port becomes the output. High frequency signals applied to the H port and low frequency signals applied to the L port are combined into a single signal at the C port.

The simplest possible diplexer is the first order diplexer (FIG. 2A), consisting of only one inductor and one capacitor. If two first-order diplexers (or any two odd-order diplexers of the same order) are simply connected back to back in such a way as to split the signal into low and high frequency components and then put them back together again, the transfer function will have the characteristics of a notch filter with no transmission at the crossover frequency.

Returning now to the discussion of FIG. 1A, an input signal 40 (which may include frequencies ranging from 0 Hz to microwave frequencies) is applied to the diplexer 32. The diplexer 32 splits the input signal 40 into two frequency bands: a high-frequency (HF) band 68 and a low-frequency (LF) band 70. The HF band 68 and LF band 70 are also shown on the graph in FIG. 3. The HF band 68 is processed in the HF channel 34, and the LF band 70 is processed in the LF channel 35. The second diplexer 38 recombines the HF band 68 and LF band 70 into a single output signal 46. Diplexers 32 and 38 are even-order diplexers of the same order and have the same crossover frequency $f_c$. Typically, second order diplexers (as shown in FIG. 2B) would be used in this system. In one embodiment, the LF band 70 extends to 0 Hertz. In another embodiment, the LF band only extends to a low frequency above 0 Hertz. For example, there are applications in which the LF band does not need to extend all the way down to 0 Hertz—instead, the LF band need only cover low frequencies down to the 5 kiloHertz range.

Figure 1B:
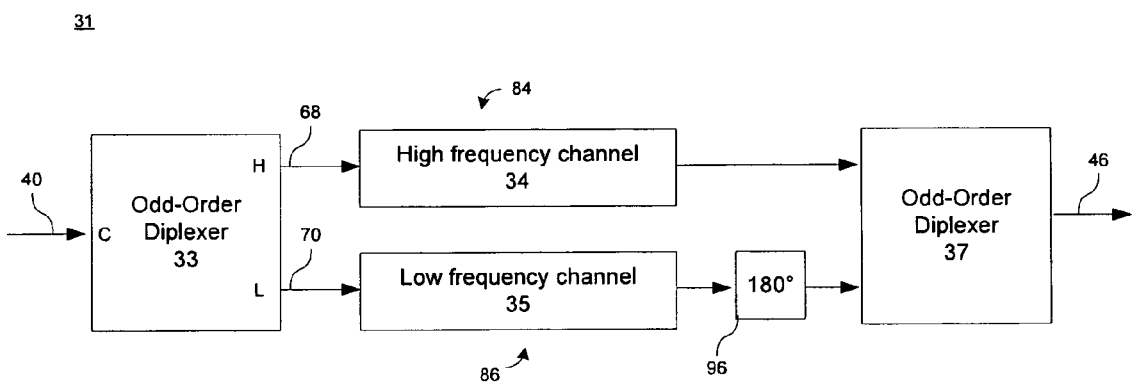
FIG. 1B shows an embodiment of a split band processing system with odd-order diplexers.

FIG. 1B shows another split-band processing system 31 that is suitable for phase-insensitive applications. The split band processing system 31 includes an odd-order diplexer 33, a high frequency (HF) circuit path 84, a low frequency (LF) circuit path 86, and another odd-order diplexer 37 that is identical to diplexer 33. The HF circuit path 84 includes a high frequency (HF) channel 34. The LF circuit path 86 includes a low frequency (LF) channel 35 and a broadband 180° phase shift 96. Elements of the split-band processing system 31 shown in FIG. 1B that correspond to elements of the split-band processing system 30 shown in FIG. 1A are indicated using the same reference numerals and will not be described again in detail.

The system 31 in FIG. 1B operates in a manner similar to the system 30 of FIG. 1A. However, by including the 180° phase shift 96 (i.e. an inversion) in the LF circuit path 86, odd-order diplexers (typically first-order diplexers as shown in FIG. 2A) can be used in the system 31. Some components that can be used to implement the 180° phase shift 96 include, but are not limited to: an inverting operational amplifier (gain=−1), a transformer, or a 180° hybrid coupler. Since the phase shift must be broadband, it cannot be implemented by a transmission line with 180° phase shift at just one particular frequency. Although the 180° phase shift 96 is shown after the LF channel 35 in the FIG. 1B, it can be located anywhere along the LF circuit path 86, e.g. before the LF channel 35, or even within the LF channel 35. The 180° phase shift 96 can also be located anywhere along the HF circuit path 84, but it cannot be located in both HF and LF circuit paths.

The systems of FIGS. 1A and 1B are useful in phase insensitive systems where a flat magnitude response is needed but the system group delay is not important. However, even in these systems, it is necessary that the group delays of the LF channel 34 and HF channel 35 are matched. Otherwise, the two signals will not properly recombine in the transition band, resulting in irregularities in |H(jω)| near the crossover frequency. But, a split-band processing system is most useful when the low frequency channel can be allowed to have less bandwidth than the high frequency channel. Unfortunately, restricting the bandwidth of a channel inevitably results in a minimum value of group delay τ on the order of $\tau = 1/(2\pi\omega_{BW})$, where $\omega_{BW}$ is the low frequency channel bandwidth as predicted by established circuit theory. Thus, if the low frequency channel has less bandwidth than the high frequency channel, the group delays will be mismatched.

Figure 4A:
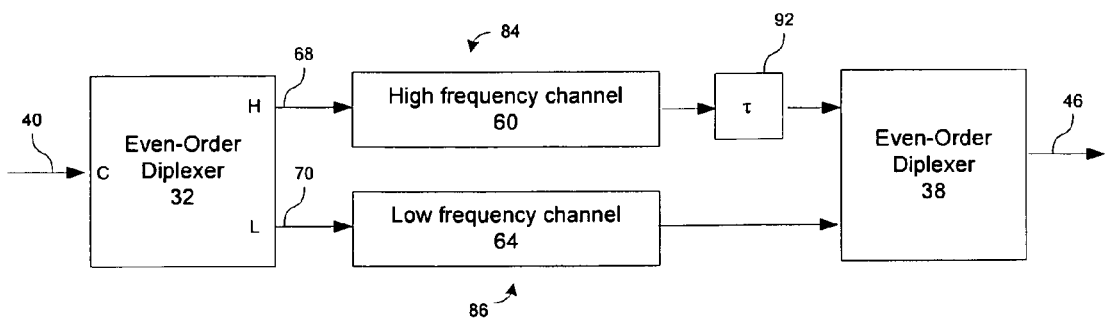
FIG. 4A shows an embodiment of a split band processing system with even-order diplexers and a time delay.
Figure 4B:
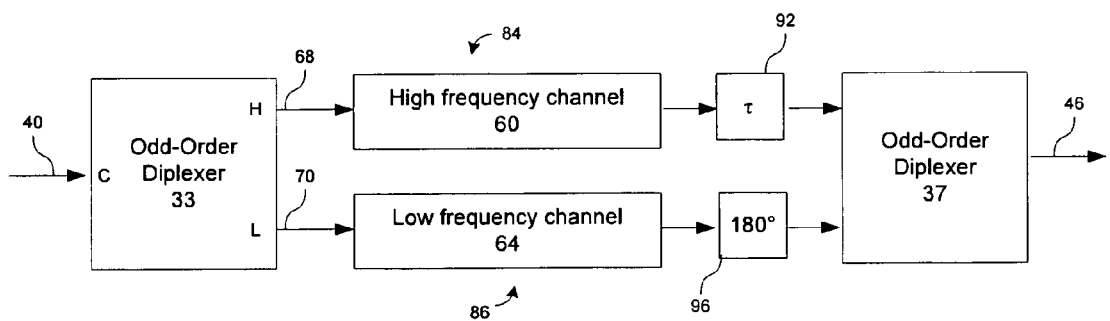
FIG. 4B shows an embodiment of a split band processing system with odd-order diplexers and a time delay.

FIGS. 4A and 4B improve upon the systems of FIGS. 1A and 1B, respectively by allowing the LF channel to have a smaller bandwidth than the HF channel. FIG. 4A shows a split-band processing system 80. The split band processing system 80 includes an even-order diplexer 32, a high frequency (HF) circuit path 84, a low frequency (LF) circuit path 86, and another even-order diplexer 38. The HF circuit path 84 includes a high frequency (HF) channel 60 and a delay element 92. The HF channel 60 includes linear signal processing circuitry optimized for operation at higher frequencies. The LF circuit path 86 includes a low frequency (LF) channel 64. The LF channel 64 includes linear signal processing circuitry optimized for operation at lower frequencies (including frequencies near or at 0 Hz), which may include DC-coupled amplifiers. The LF channel 64 has a bandwidth $\omega_{BW}$ that is smaller than the bandwidth of the HF channel 60. Elements of the split-band processing system 31 shown in FIG. 4A that correspond to elements of the split-band processing system 30 shown in FIG. 1A are indicated using the same reference numerals and will not be described again in detail.

The system 80 in FIG. 4A operates in a manner similar to the system 30 of FIG. 1A. However, a delay element 92 that implements a time delay $\tau$ has been added to the HF circuit path 84. The delay element 92 equalizes the group delay between the HF circuit path 84 and the LF circuit path 86. In situations where the group delay of the HF channel 60 is negligible, the value of the time delay $\tau$ is equal to the average group delay of the LF channel 64. The average group delay of the LF channel 64 can be determined by using a circuit simulator, or by measuring it directly. If the LF channel group delay is not constant, the group delay at the crossover frequency $f_c$ should be used. In situations where there is a non-negligible group delay associated with the HF channel 60, $\tau$ should equal the difference between the LF channel group delay and the HF group delay. Although the delay element 92 is shown in the figure after the HF channel 60, it can be located anywhere along the HF circuit path 84, e.g. before the HF channel 60 or even within the HF channel 60.

FIG. 4B shows a split-band processing system 81. The system 81 in FIG. 4B is similar to the system 80 in FIG. 4A, except that it includes a 180° phase shift 96 in the LF circuit path 86 so that odd-order diplexers 33 and 37 can be used to split and recombine the signals. As with the system 31 in FIG. 1B, the 180° phase shift 96 can either be inserted anywhere along the LF circuit path 86, or anywhere along the HF circuit path 84, but not in both circuit paths.

There are various ways of implementing the delay elements 92 in the systems 80 and 81 of FIGS. 4A and 4B. For example, the delay element 92 may be implemented with a coaxial cable having a length that corresponds to the delay required. One drawback to using a coax cable is that at high frequencies, an impracticably long length may be needed to implement the required time delay. Furthermore, a long coax cable may cause too much signal loss.

Figure 5A:
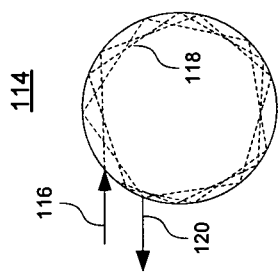
FIGS. 5A-5C show various exemplary implementations of the time delay.
Figure 5C:
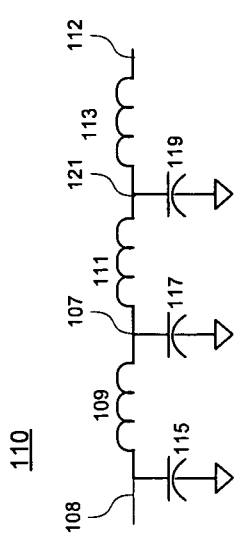
Figure 5B:
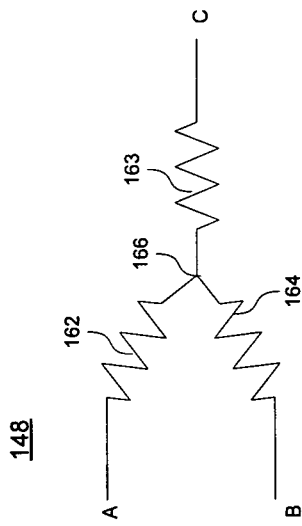

FIGS. 5A-5C show additional ways of implementing a time delay of $\tau$. FIG. 5A shows a schematic of a lumped-element ladder 110 to implement the time delay $\tau$. A series of inductors 109, 111, and 113 are connected between an input 108 and an output 112. The node between inductors 109 and 111 is identified with reference number 107. The node between inductors 111 and 113 is identified with reference number 121. A capacitor 115 is connected between the input 108 and ground. A second capacitor 117 is connected between node 107 and ground. A third capacitor 119 is connected between node 121 and ground. A signal applied to the input 108 of the lumped-element ladder 110 is delayed by $\tau$ by the time it reaches the output 112. The number of inductors and capacitors shown in FIG. 5A are only exemplary—the actual number of capacitors and inductors needed in the lumped-element ladder 110 can vary, and is dependent upon the size of time delay $\tau$.

FIG. 5B shows a piezoelectric bulk acoustic wave (BAW) device 114 for implementing the delay element 92. The BAW device 114 converts an electrical input signal 116 into an acoustical wave 118. The acoustical wave 118 bounces around within the BAW device 114 until the desired delay $\tau$ is achieved. Then, the acoustical wave 118 is converted back into an electrical output signal 120. A surface acoustical wave (SAW) device can also be used to implement the time delay $\tau$.

FIG. 5C shows an electro-optical system 122 for implementing the delay element 92. An electrical signal applied to the input 124 of the electro-optical system 122 is converted to an optical signal by an electrical-to-optical signal converter 126. The electrical-to-optical signal converter 126 is connected to an optical waveguide 128, such as a fiber optic cable. The length of the optical waveguide 128 is determined by the amount of time delay $\tau$ that is needed. The optical signal is delayed as it travels through the length of the optical waveguide 128. An optical waveguide is not as lossy as a coax cable, so an optical signal should not deteriorate as much in an optical waveguide, as an electrical signal would in a coax cable having an equivalent delay of $\tau$. The optical waveguide 128 is connected to an optical-to-electrical signal converter 130, which converts the optical signal back to an electrical signal at the output 132. The implementations for delay element 92 shown in FIGS. 5A-5C are merely exemplary and are not intended to be limiting on the embodiments of the present invention.

The systems described above in FIGS. 3A, 3B, 4A, and 4B are limited to phase insensitive applications. The group delay of the transfer function will not be constant, nor will the phase vs. frequency be linear. For some systems, it is possible to use a phase equalizer block to linearize the phase of a system with non-linear phase. However, the phase function for the systems described above is in the class of "non-minimum phase functions," as known in circuit theory. It can be shown that it is impossible to construct a phase equalizer for such a function, because the equalizer transfer function would have to be the inverse of the system transfer function, and the inverse of a non-minimum phase function is non-realizable.

Figure 6A:
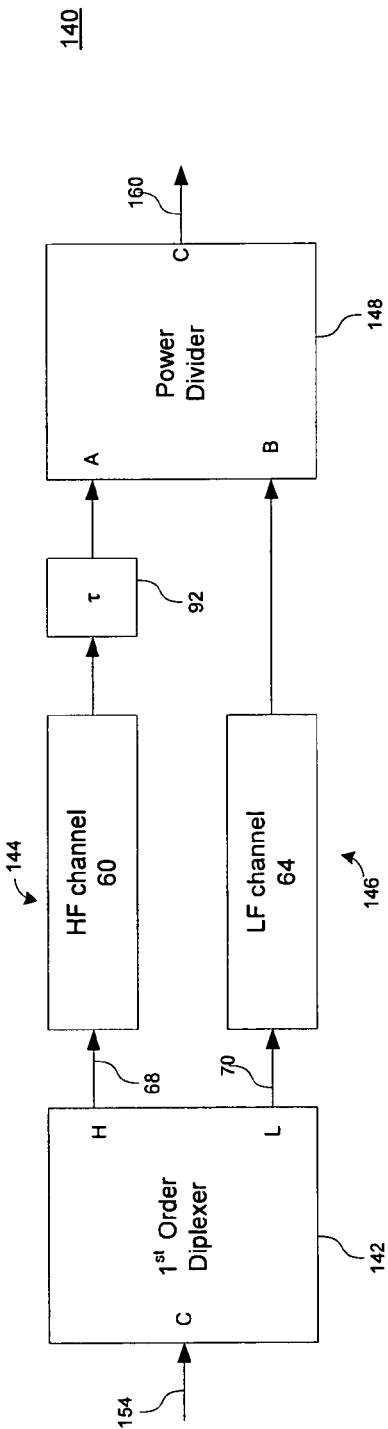
FIGS. 6A-6B show embodiments of a split band processing system having linear phase.

By constraining one of the two diplexers in the system of FIG. 4B to be a first-order diplexer, and replacing the other diplexer with a power divider, the system can be made to have both flat magnitude response and linear phase response. FIG. 6A shows a block diagram of another split-band processing system 140 in accordance with an embodiment of the present invention. The system 140 includes a first-order diplexer 142, an HF circuit path 144, a LF circuit path 146, and a power divider 148. The HF circuit path 144 includes a HF channel 60 and a time delay 92. The LF circuit path 146 includes a LF channel 64. Elements of the split-band processing system 140 shown in FIG. 6 that correspond to elements of the split-band processing system 80 shown in FIG. 4B are indicated using the same reference numerals and will not be described again in detail.

An analog input signal 154 is applied to the C port of the first-order diplexer 142. The analog input signal 154 may include 0 Hz to microwave frequencies, but this is not a requirement. The first-order diplexer 142 divides the analog input signal 154 into two frequency bands—the output of the H port is an HF band 68; and the output of the L port is an LF band 70. The LF band 70 typically has a smaller bandwidth than the HF band 68.

The HF band 68 is sent through the HF circuit path 144. First, the HF band 68 is processed in HF channel 60. Then, to equalize the group delays between the HF band 68 and the LF band 70, the HF band 68 passes through a delay element 92. Although the delay element 92 is shown in the figure after the HF channel 60, it can be located anywhere along the HF circuit path 144, e.g. before the HF channel 60 or even within the HF channel 60. The delay element 92 delays the HF band 68 by an amount of time τ. The HF band 68 passes through the delay element 92 to the A port of the power divider 148.

The LF band 70 is sent through the LF circuit path 146. The LF band 70 is processed in LF channel 64 and passes to the B port of the power divider 148.

After passing through their respective circuit paths, the HF band 68 and the LF band 70 are recombined by the power divider 148. The power divider 148 outputs a single output signal 160 at its C port.

Figure 7:
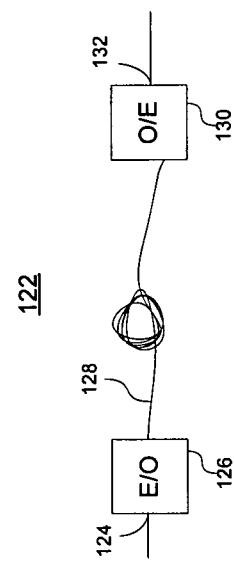
FIG. 7 shows an exemplary power divider.

FIG. 7 shows an exemplary power divider 148. Like a diplexer, the power divider is also a reciprocal, passive device. The power divider 148 has 3 ports A, B, and C. A resistor 162 is connected between port A and an internal node 166. Another resistor 164 is connected between port B and the internal node 166. A third resistor 163 is connected between the internal node 166 and port C. All three resistors have a value equal to ⅓ of the system characteristic impedance. The power divider 148 can be used as both a signal divider and a signal combiner. A power divider has an inherent 6 dB loss, unlike a diplexer which ideally has no loss associated with it. Another suitable power divider (not shown) can be formed by connecting three resistors in a "delta" configuration, as opposed to the "Y" configuration shown here in FIG. 7.

Figure 6B:
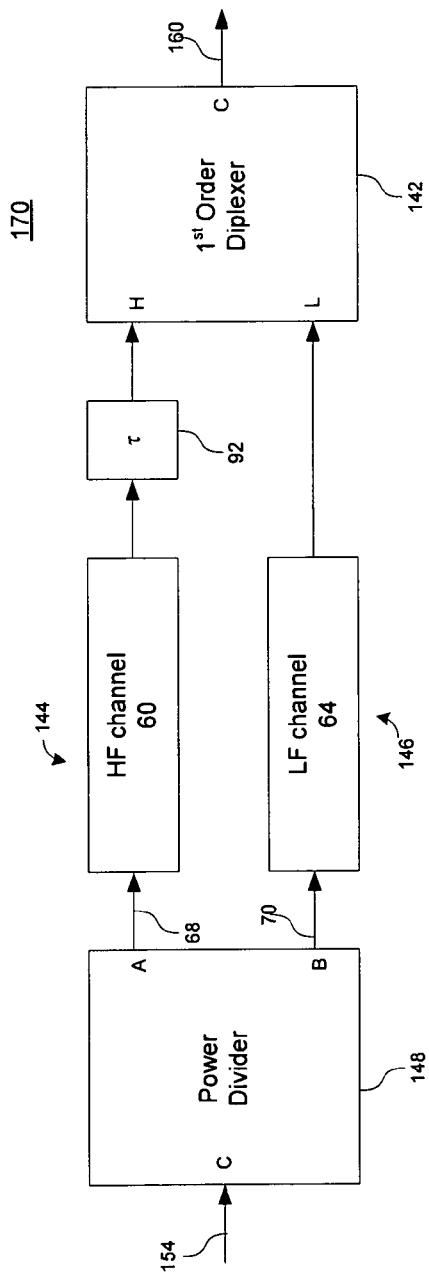

Refer now to FIG. 6B, which shows a block diagram of another split-band processing system 170 in accordance with an embodiment of the present invention. The system of FIG. 6B is similar to the one described in FIG. 6A, except that the positions of the first-order diplexer 142 and the power divider 148 are interchanged within the system. These devices can be interchanged because the diplexer 142 and power divider 148 are reciprocal devices, and can be used as either signal dividers or signal combiners. Elements of the split-band processing system 170 shown in FIG. 6B that correspond to elements of the split-band processing system 140 shown in FIG. 6A are indicated using the same reference numerals and will not be described again in detail.

In FIG. 6B, the power divider 148 receives the input signal 154 at its C port and divides it into an HF band 68 and an LF band 70. The HF band 68 is processed in the HF circuit path 144 as described above for FIG. 6A. The LF band 70 is processed in the LF circuit path 146 as described above for FIG. 6A. The HF band 68 and LF band 70 are recombined by the first-order diplexer 142 to generate a single output signal 160.

As mentioned previously, the transfer functions H(jω) for the systems of FIGS. 6A and 6B have flat magnitude response and linear phase. The choice of whether to use the system of FIG. 6A or 6B depends on whether input signal noise or signal output power is the primary constraint. If input signal noise is a greater concern, then the system 140 of FIG. 6A is a better choice. If output power is the primary concern, then the system 170 of FIG. 6B will have better performance.

In the systems discussed so far, the time delay τ, may be difficult to implement. For example, the number of elements needed in a lumped-element ladder to achieve the needed time delay τ may be so large as to be impracticable. Or, the length of coaxial cable required may be so long that the signal deteriorates too much over its length to be usable, which is especially true when the signals are at microwave frequencies. A figure of merit for delay lines is the delay-bandwidth product. Large delay-bandwidth products are difficult to implement. If the ratio of the high frequency channel bandwidth to the crossover frequency is high, the required delay-bandwidth product will be high. This limits the practical spread between high frequency channel bandwidth and crossover frequency.

Figure 8A:
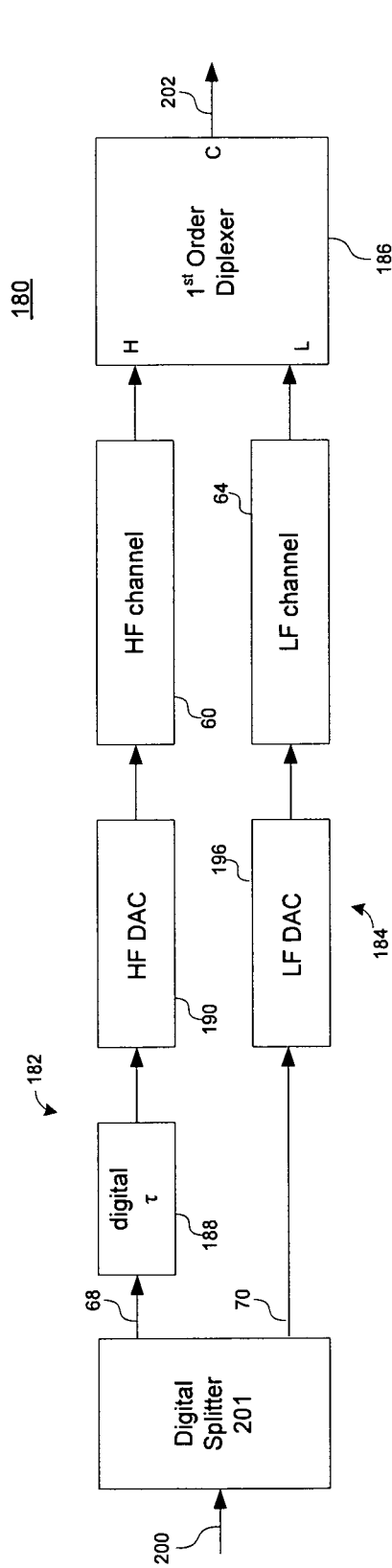
FIGS. 8A-8B show embodiments of a mixed-signal split band processing system.

Mixed-signal systems in which a signal is converted from digital to analog (or vice versa) can take advantage of such a conversion to implement a time delay within the digital domain. FIG. 8A shows a mixed-signal split-band signal processing system 180 in accordance with one embodiment of the present invention. The system 180 includes a digital splitter 201, a HF circuit path 182, a LF circuit path 184, and a first-order diplexer 186. The HF circuit path 182 includes a digital delay element 188, an HF digital-to-analog converter (DAC) 190, and a HF channel 60. The LF circuit path 184 includes a LF DAC 196, and a LF channel 64. Elements of the mixed-signal split-band processing system 180 shown in FIG. 8A that correspond to elements of the split-band processing system 140 shown in FIG. 6A are indicated using the same reference numerals and will not be described again in detail.

A digital input signal 200 is split by a digital splitter 201 into an HF band 68 and an LF band 70. The digital splitter 201 will need to do an appropriate sample rate conversion (such as decimating the digital input signal 200) so that the samples in the LF band 70 are matched to the lower clock rate of the LF DAC 196. Splitting a digital input signal into high frequency and low frequency signals is well-known in the art, so the details of the digital splitter 201 will not be discussed in further detail. The HF band 68 passes through the HF circuit path 182. First, the HF band 68 is delayed by the digital delay element 188 by an amount of time τ. The HF band 68 is then converted into an analog signal by the HF DAC 190. The HF channel 60 processes the analog signal, and outputs the HF band 68 to the H port of the diplexer 186.

The LF band 70 passes through the LF circuit path 184. The LF band 70 is converted from a digital into an analog signal by the LF DAC 196. The LF channel 64 processes the analog signal, and outputs the LF band 70 to the L port of the first-order diplexer 186. The first-order diplexer 186 recombines the HF band 68 and the LF band 70. The first-order diplexer 186 outputs a single analog output signal 202 at its C port.

The value of digital delay τ is selected to equalize the group delay between the HF band 68 and the LF band 70. It is straightforward to implement digital delay element 188 using memory elements such as dual ported block RAMs or circular buffers. The memory elements should have the capacity to store digital samples from the digital input signal 200 for the required amount of time τ. When implementing the delay τ in the digital domain, it is sufficient to delay the signal in the memory to within the nearest integer clock period of the HF DAC.

By implementing the delay τ digitally, the transfer function H(jω) for this system 180 has flat magnitude response and linear phase response. The system 180 also has the potential for more output power and increased flexibility to convert between unbalanced and balanced signals.

Figure 8B:
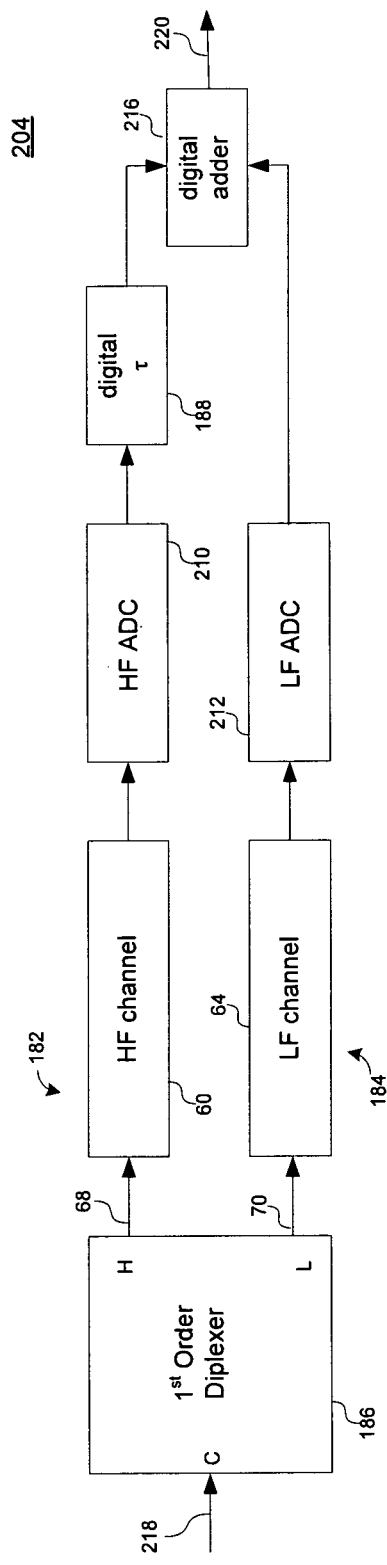

FIG. 8B shows a mixed-signal split-band signal processing system 204 in accordance with one embodiment of the present invention. The system 204 of FIG. 8B is similar to the system described in FIG. 8A. However, the system 204 takes an analog signal 218 as input and converts it to a digital output signal 220. Elements of the system 204 shown in FIG. 8B that correspond to elements of the system 180 in FIG. 8A are indicated using the same reference numerals and will not be described again in detail.

The system 204 includes a first-order diplexer 186, a HF circuit path 182, a LF circuit path 184, and a digital adder 216. The HF circuit path 182 includes an HF channel 60, an HF analog-to-digital converter (ADC) 210, and a digital time delay 188. The LF circuit path 184 includes a LF channel 64, and an LF ADC 212.

An analog input signal 218 is applied to the C port of the first-order diplexer 186. The first-order diplexer 186 splits the input signal 218 into two bands: an HF band 68 at the H port and a LF band 70 at the L port.

The HF band 68 is sent through the HF circuit path 182. First the HF band 68 is processed in the HF channel 60. Then, it is converted from an analog into a digital signal by the HF ADC 210. The HF band 68 is then delayed by an amount of time τ by the digital delay element 188.

The LF band 70 is sent through the LF circuit path 184. The LF band 70 is processed in the LF channel 64. Then it is converted from an analog to a digital signal by the LF ADC 212.

Finally the digital adder 216 adds the HF band 68 and the LF band 70 together to form digital output signal 220. The digital adder 216 will need to do an appropriate sample rate conversion (such as interpolating the output of the LF ADC 212) so that the samples from the higher clock rate in the HF ADC can be combined with samples from the lower clock rate in the LF ADC. Combining high- and low-frequency digital signals is well-known in the art, so the details of the digital adder 216 will not be discussed in further detail.

By implementing the delay τ digitally, the transfer function H(jω) for this system 204 also has flat magnitude response and linear phase response. The system 204 has the potential for better sensitivity, more dynamic range, and the ability to remove a DC offset at the input. Furthermore, the system 204 has increased flexibility to convert between unbalanced and balanced signals.

Systems in which a signal is converted from optical to electrical (or vice versa) can take advantage of such a conversion to implement a time delay in the optical domain. One advantage of being in the optical domain is that large delay bandwidth products are more easily obtained with optical fiber. FIG. 9A shows a block diagram of an optical-electrical split band processing system 230. The system 230 includes an optical splitter 232, an HF circuit path 234, a LF circuit path 236, and a first-order diplexer 186. The HF circuit path 234 includes an optical delay element 238, a HF optical-to-electrical (O/E) converter 240, and a HF channel 60. The LF circuit path 236 includes a LF optical-to-electrical (O/E) converter 244 and a LF channel 64. Elements of the optical-electrical system 230 shown in FIG. 9A that correspond to elements of the mixed-signal split-band processing system 180 shown in FIG. 8A are indicated using the same reference numerals and will not be described again in detail.

An optical input signal 248 is divided into two frequency bands by the optical splitter 232: an HF band 68 and an LF band 70. The HF band 68 is sent through the HF circuit path 234, and the LF band 70 is sent through the LF circuit path 236.

The HF band 68 passes through the optical delay element 238 and is delayed by an amount of time τ. The optical delay element 238 is implemented using an optical waveguide, such as a fiber optic cable. The use of an optical waveguide as a delay element has already been previously described with respect to FIG. 5C and therefore won't be described in further detail. The HF band 68 is then converted from an optical signal into an electrical signal by the HF optical-to-electrical converter 240. The electrical signal is processed by the HF channel 60, which outputs the HF band 68 to the H port of diplexer 186.

The LF band 70 is converted from an optical signal into an electrical signal by the LF optical-to-electrical converter 244. The electrical signal is processed by the LF channel 64, which outputs the LF band to the L port of diplexer 186. The first-order diplexer 186 recombines the HF band 68 and the LF band 70 back into an electrical output signal 262.

By implementing the delay τ optically, the transfer function H(jω) for this system 180 has flat magnitude response and linear phase response.

FIG. 9B shows a block diagram of an electrical-optical split band processing system 270. The system 270 of FIG. 9B is similar to the system described in FIG. 9A. However, the system 270 takes an electrical signal 218 as input and converts it to an optical output signal 266.

The system 270 includes a first-order diplexer 186, a HF circuit path 234, a LF circuit path 236, and an optical adder 264. The HF circuit path 234 includes an HF channel 60, an HF electrical-to-optical (E/O) converter 268, and an optical delay element 238. The LF circuit path 236 includes a LF channel 64 and a LF electrical-to-optical (E/O) converter 272. Elements of the electrical-optical system 270 shown in FIG. 9B that correspond to elements of the optical-electrical system 230 shown in FIG. 9A are indicated using the same reference numerals and will not be described again in detail.

A first-order diplexer 186 divides an electrical input signal 218 into two frequency bands: an HF band 68 and an LF band 70. The HF band 68 is sent through the HF circuit path 234, and the LF band 70 is sent through the LF circuit path 236.

The HF band 68 is first processed by the HF channel 60. Then it is converted from an electrical into an optical signal by the HF E/O converter 268. The HF band 68 then passes through the optical delay element 238 and is delayed by an amount of time τ.

The LF band 70 is first processed by the LF channel 64. Then it is converted from an electrical into an optical signal by the LF electrical-to-optical converter 272. The optical adder 264 adds the HF band 68 and the LF band 70 together into a single optical output signal 266.

By implementing the delay τ optically, the transfer function H(jω) for this system 180 has flat magnitude response and linear phase response.

Figure 10:
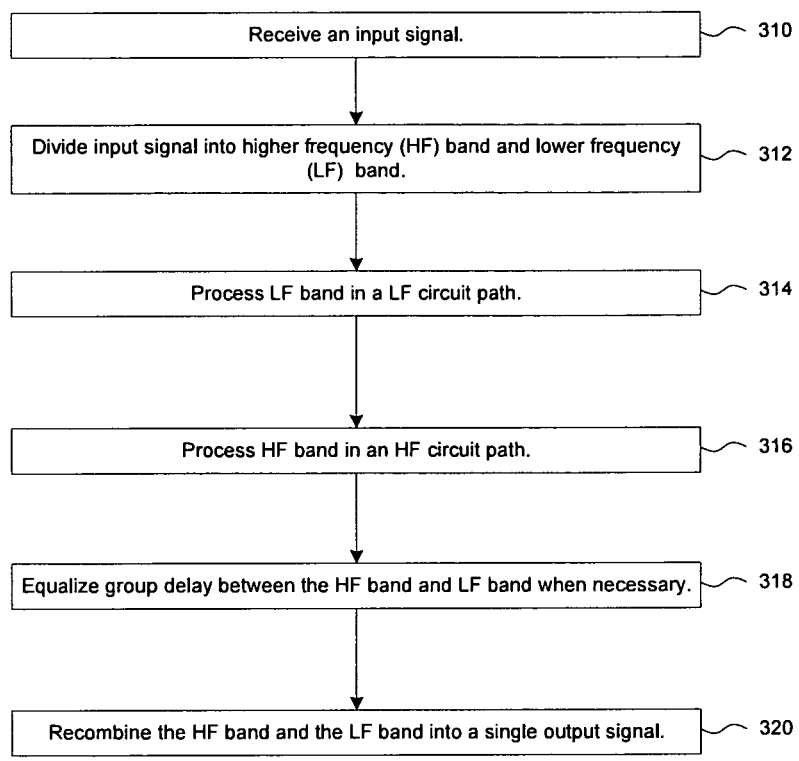
FIG. 10 shows a flowchart of a method for split band processing, in accordance with various embodiments of the present invention.

FIG. 10 shows a flowchart of a method for split band processing, in accordance with various embodiments of the present invention. Note that although there are sequentially numbered steps in FIG. 10, the steps do not necessarily have to be performed in the same sequence that they are presented in the flowchart. In step 310, a split-band processing system receives an input signal. The input signal is capable of including signal frequencies from 0 Hz to microwave frequencies, although this is not a requirement. In step 312, the input signal is split into two bands: a higher frequency (HF) band and a lower frequency (LF) band. The HF band includes higher frequency signals, which may include microwave frequencies. The LF band includes lower frequency signals, including signals at 0 Hz (DC).

In step 314, the LF band is processed in a LF circuit path which includes linear signal processing circuitry optimized for operation at lower frequencies.

In step 316, the HF band is processed in an HF circuit path, which includes linear signal processing circuitry optimized for operation at higher frequencies.

In step 318, the group delays of the HF band and the LF band are equalized when necessary. If necessary, a 180° phase inversion is also introduced.

Finally, in step 320, the HF band and the LF band are recombined into a single output signal.

It should be noted that, while the embodiments disclosed here only show split-band signal processing systems where the input signal is split into two bands, it should be apparent to one of ordinary skill in the art that the teachings of the present invention can be extended to systems in which the input signal is split into more than two bands.

Although the present invention has been described in detail with reference to particular embodiments, persons possessing ordinary skill in the art to which this invention pertains will appreciate that various modifications and enhancements may be made without departing from the spirit and scope of the claims that follow.

What is claimed is:

1. A system for processing a broadband input signal, comprising:
    a signal divider that divides the input signal into at least a higher frequency band and a lower frequency band;
    a lower frequency circuit path that processes the lower frequency band;
    a higher frequency circuit path that processes the higher frequency band, the higher frequency circuit path having a group delay substantially equal to the lower frequency circuit path; and
    a signal combiner capable of combining the processed lower frequency band and the processed higher frequency band into an output signal.

2. A system as in claim 1, further comprising a delay element in the higher frequency circuit path to equalize group delay between the higher frequency circuit path and the lower frequency circuit path.

3. A system as in claim 2, wherein
    the input signal or the output signal is a digital signal; and
    the delay element includes a digital memory element.

4. A system as in claim 3, wherein
    the lower frequency circuit path includes a data converter,
    the higher frequency circuit path includes a data converter, and
    the delay element delays a digital signal in the higher frequency circuit path.

5. A system as in claim 2, wherein
    the input signal or the output signal is an optical signal; and
    the delay element is an optical waveguide.

6. A system as in claim 1, wherein the signal combiner or the signal divider includes a diplexer.

7. A system as in claim 6, wherein:
    the signal combiner or the signal divider includes an odd-order diplexer, and
    a 180 degree phase shift is included in either the higher frequency circuit path or the lower frequency circuit path.

8. A system as in claim 1, wherein the signal combiner or the signal divider includes a power divider.

9. A system as in claim 1, wherein
    the signal divider is a first diplexer;
    the signal combiner is a second diplexer; and
    the delay element is selected from the group consisting of a transmission line, a lumped-element ladder, a bulk acoustic wave device, and an optical waveguide.

10. A system as in claim 1, wherein the lower frequency band covers 0 Hertz.

11. A system as in claim 1, wherein the higher frequency band includes microwave frequencies.

12. A system as in claim 1, wherein a transfer function $H(j\omega)$ for the output signal and input signal has a substantially that magnitude response.

13. A system as in claim 1, wherein the transfer function $H(j\omega)$ for the output signal and input signal has linear phase.

14. A system as in claim 1, wherein the lower frequency band has a smaller bandwidth than the higher frequency band.

15. A method for processing a broadband input signal, comprising:
    receiving an input signal;
    dividing the input signal into at least a higher frequency band a lower frequency band;
    processing the lower frequency band in a lower frequency circuit path;
    processing the higher frequency band in an higher frequency circuit path;
    when the lower frequency circuit path has a different group delay than the higher frequency circuit path, equalizing the group delays of the lower frequency circuit path and the higher frequency circuit path; and
    recombining the processed higher frequency band and the processed lower frequency band into a single output signal.

16. A method as in claim 15, wherein equalizing the group delay includes delaying the higher frequency band.

17. A method as in claim 16, wherein delaying the higher frequency band includes delaying a digital signal by storing the digital signal in memory.

18. A method as in claim 16, wherein delaying the higher frequency band includes delaying an optical signal.

19. A system as in claim 16, further comprising delaying the higher frequency band by a time delay of .tau., where .tau. is the group delay of the lower frequency circuit path.

20. A system as in claim 15, wherein the lower frequency band covers 0 Hertz.

* * * * *

UNITED STATES PATENT AND TRADEMARK OFFICE
CERTIFICATE OF CORRECTION

PATENT NO.        : 8,483,318 B2                                    Page 1 of 1
APPLICATION NO.   : 12/264773
DATED             : July 9, 2013
INVENTOR(S)       : Richard K Karlquist It is certified that error appears in the above-identified patent and that said Letters Patent is hereby corrected as shown below:

In the Claims

In column 12, line 18, In Claim 12, delete "that" and insert -- flat --, therefor.

In column 12, line 28, In Claim 15, after "band" insert -- and --.

In column 12, line 48, In Claim 19, delete ".tau., where .tau." and insert -- $\tau$, where $\tau$ --, therefor.

Signed and Sealed this
Twenty-fourth Day of September, 2013

Teresa Stanek Rea
*Deputy Director of the United States Patent and Trademark Office*